(12) United States Patent
Alexander et al.

(10) Patent No.: US 7,435,912 B1
(45) Date of Patent: Oct. 14, 2008

(54) TAILORING VIA IMPEDANCE ON A CIRCUIT BOARD

(75) Inventors: Arthur R. Alexander, Valley Center, CA (US); James L. Knighten, Poway, CA (US); Jun Fan, Escondido, CA (US)

(73) Assignee: Teradata US, Inc., Miamisburg, OH (US)

( * ) Notice: Subject to any disclaimer, the term of this patent is extended or adjusted under 35 U.S.C. 154(b) by 1171 days.

(21) Appl. No.: 10/145,436

(22) Filed: May 14, 2002

(51) Int. Cl.
*H01R 12/04* (2006.01)
*H05K 1/11* (2006.01)

(52) U.S. Cl. ...................... 174/262; 361/761
(58) Field of Classification Search ......... 174/262–266; 361/761–764
See application file for complete search history.

(56) References Cited

U.S. PATENT DOCUMENTS

| | | | | |
|---|---|---|---|---|
| 3,739,469 A | * | 6/1973 | Dougherty, Jr. | 29/852 |
| 5,774,333 A | * | 6/1998 | Janik et al. | 361/687 |
| 6,229,095 B1 | * | 5/2001 | Kobayashi | 174/255 |
| 6,486,414 B2 | * | 11/2002 | Kobayashi et al. | 174/261 |
| 6,617,526 B2 | * | 9/2003 | Miller | 174/261 |
| 6,706,975 B2 | * | 3/2004 | Sumi et al. | 174/264 |
| 6,887,779 B2 | * | 5/2005 | Alcoe et al. | 438/620 |
| 2001/0011607 A1 | * | 8/2001 | Moriizumi et al. | 174/262 |
| 2003/0201123 A1 | * | 10/2003 | Kistner | 174/261 |

OTHER PUBLICATIONS

U.S. Appl. No. 10/641,476, filed Aug. 15, 2003, Alexander et al.
U.S. Appl. No. 10/274,573, filed Oct. 21, 2002, Alexander et al.

* cited by examiner

*Primary Examiner*—Jeremy C Norris
(74) *Attorney, Agent, or Firm*—Trop, Pruner & Hu, P.C.; James Stover

(57) ABSTRACT

A circuit board includes multiple signal layers, in which signal lines are routed, and reference plane layers, in which power reference planes are provided. To connect signal lines at different signal layers, vias are passed through at least one signal layer and at least one reference plane layer. At the one signal layer, a first clearance (or anti-pad) is defined around the via. At the reference plane layer, a second clearance is defined around the via. The second clearance is larger in size than the first clearance to match the impedance of the via as closely as possible with the impedance of a signal line the via is electrically connected to.

11 Claims, 4 Drawing Sheets

TAILORING VIA IMPEDANCE ON A CIRCUIT BOARD

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, by use of connectors or by directly mounting the devices on to a surface of the circuit board. A circuit board includes the wiring required to interconnect the devices electrically and to act as a primary support for the devices.

A circuit board typically includes multiple layers, which can range from two layers to fifty or more layers, as examples. Some layers are used for signal transmission, while other layers are used for power reference planes. A power reference plane is a plane that is connected to a reference voltage, such as ground, a three-volt voltage, a five-volt voltage, or some power supply other voltage. Some reference planes may even be coupled to more than one voltage.

As IC technology has steadily improved, the number of transistors that can be placed into each IC device has dramatically increased. This has led to a corresponding increase in the number of input/output (I/O) pins on such IC devices. The increase in I/O pins on IC devices means that more signals are routed on a circuit board, which in turn means a higher circuit wiring density on the circuit board. Also, as the number of layers increase to accommodate the increased number of signal lines, the number of vias in any given path also increases. A via is an electrical connection that is run through multiple layers of the circuit board to connect signal lines at different layers. Typically, the via is run perpendicularly to the main surface of the circuit board. In forming a via, some amount of dielectric material is removed by drilling, laser, light, or other methods. Next, an electrically conductive metal, usually copper, is flowed or plated into the void to provide the electrical connection between signal lines at different layers.

To avoid shorting problems, minimum clearances are defined between each via and the surrounding signal wires or reference planes. To maximize the density of wires that can be run through each layer of the circuit board, it is desirable for the spacing between the signal lines and a via to be the minimum possible while still avoiding short-circuit problems. Circuit board design and manufacturing methods require minimum clearance dimensions to be maintained equally on all board layers, regardless of whether the layer is a signal layer or a power reference layer.

Typically, a transmission line on a circuit board is formed between a signal trace (routed through a signal layer of the circuit board) and a reference plane (that is provided in a reference plane layer of the circuit board). A circuit board is designed to achieve transmission lines with a target characteristic impedance, which is usually 50 Ohms or 75 Ohms. The characteristic impedance of a transmission line is dependent on several factors: the inductance of the conductors that make up the transmission line, the dielectric medium, the distance to a reference plane, and the capacitance between the conductors.

Because vias are configured differently than signal traces, the characteristic impedance of each via is usually different than that of each transmission line. Usually, the impedance of a via is less than the characteristic impedance of signal transmission lines on the circuit board. As a result, if a signal path is routed through one or more vias between different layers of the circuit board, impedance discontinuities are introduced by the presence of the vias. For signals having low frequencies, the feature dimension of a via is usually much less than a wavelength of each signal. Therefore, such a low-frequency signal usually does not experience effects of impedance discontinuity introduced by the vias. However, as the frequency of the signal increases, the feature dimension of the via becomes a significant portion of, or is even larger than, a wavelength of the signal. The transmission line impedance discontinuity introduced by vias along a signal path can cause reflections, which degrades the signal and causes performance in a system to degrade.

The characteristic impedance of the via is usually lower than the desired transmission line impedance of 50 Ohms or 75 Ohms. Increasing the impedance of the via usually requires increasing the minimum clearance dimension (even on the signal layers carrying signal lines), which has an undesirable result of decreasing the area available for routing of transmission lines on signal layers. Decreased routing area is usually undesirable since the alternatives to combat this are to either increase the dimensions of the board, or to add signal layers to the board.

SUMMARY

In general, a mechanism is provided to reduce or eliminate impedance discontinuity due to an unmatched via impedance. For example, in one embodiment, a circuit board includes a first layer containing signal lines, a second layer containing a reference plane, and a via passing through the first layer and the second layer. A first clearance is defined around the via at the first layer, and second clearance is defined around the via at the second layer. The second clearance is larger than the first clearance to adjust the characteristic impedance of the via to match as closely as possible the transmission line characteristic impedance on the circuit board.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
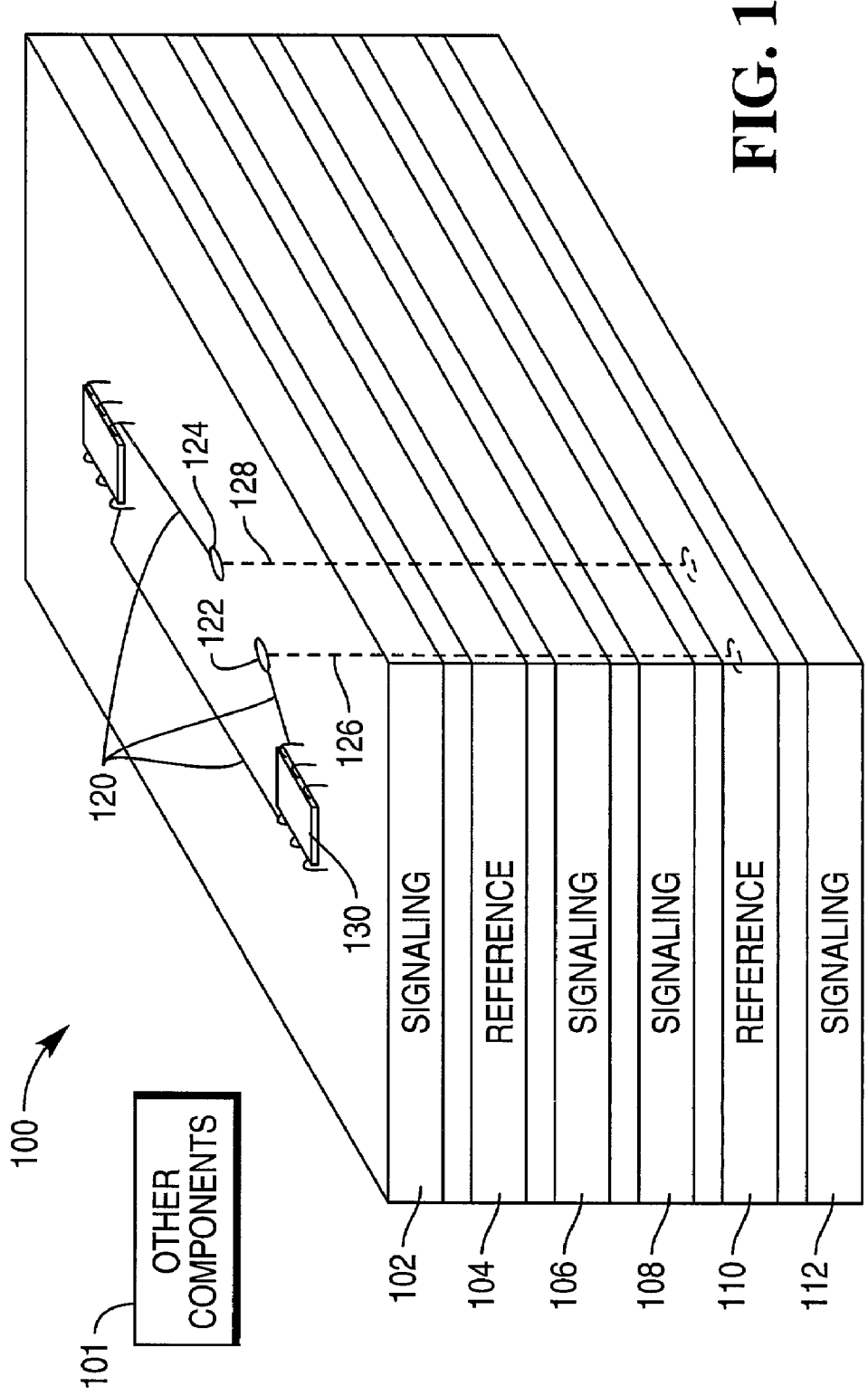
FIG. 1 illustrates an example arrangement of a circuit board.

As shown in FIG. 1, an example circuit board 100 includes multiple layers 102, 104, 106, 108, 110 and 112. As used here, a "circuit board" refers to any structure on or in which signal wires or conductors are routed and in which power reference planes are provided. Examples of a "circuit board" include printed wiring boards (PWBs) and printed circuit boards (PCBs). A "circuit board" also covers any package, such as an integrated circuit (IC) package, that has multiple layers of signal wires or conductors and power reference planes. The circuit board 100 is part of a system that includes various components, such as a hard disk drive, display, central processing unit, power supply, and so forth. The central processing unit and various controllers can be mounted on the circuit board 100 (e.g., devices 130). The power supply and hard disk drive are included as "other components" 101 in FIG. 1.

The layers 102, 106, 108, and 112, in the illustrated example, are signal layers for carrying signal wires, while the layers 104 and 110 are power reference plane layers. In each signal layer of the circuit board 100, signal traces are routed through the layer. All reference planes are attached to either power or ground in some combination (such as a 3-volt, 5-volt, or other voltage). Thus, for example, the reference plane for layer 104 is connected to voltage, while the reference plane layer 110 is connected to ground potential. In some implementations, a reference plane is formed of a solid sheet of electrically conductive metal (or other electrically conductive material), with openings formed in the solid sheet for vias or other through-hole structures.

In the example shown in FIG. 1, devices 130 are mounted on a planar surface of the circuit board 100. Signal traces 120 in the layer 102 route signals from the devices 130 to other points on the circuit board 100. In the example shown in FIG. 1, some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100. In the example shown in FIG. 1, the vias 126 and 128 are passed from the top signal layer 102 to the bottom signal layer 112 of the circuit board. Other vias can be connected between any pair of signal layers.

A "via" refers generally to any electrically conductive structure that electrically connects lines or components at different layers of a circuit board. The circuit board 100 has a main surface that is generally parallel to the signal traces and power reference planes. Vias are routed in a direction that is generally perpendicular to the main surface of the circuit board 100. However, other embodiments of the invention also cover cases where vias are routed at other angles with respect to the main surface through multiple layers of the circuit board.

Typically, a through-hole is formed through the layers through which a via is to pass, with an electrically conductive material (such as a metal) deposited or otherwise formed in the through-hole to make an electrical connection.

When a via is passed through one or more layers, minimum clearances are defined around the via at each of these layers to avoid short-circuiting the via to either a power or ground plane or to another signal. Thus, for example, for each of the vias 126 and 128, clearances are defined around the via 126 or 128 at each of layers 104, 106, 108, and 110. The clearances are also referred to as "anti-pads." Basically, a "clearance" is a defined region around a via in each layer of the circuit board through which an electrically conductive structure other than the via or a signal trace intended to connect to the via is not allowed to pass. The clearance can be circular, rectangular, or any other shape.

To enhance wire density at each signal layer, the clearance defined around a via at the signal layer is desired to have as small a feature as possible while still being effective in isolating the via and electrically conductive structures at the signal layer.

While density of signal traces at a signal layer is desired to enable more signal wires to be run through each signal layer of the circuit board 100, the same goal usually does not extend to reference plane layers of the circuit board. That is because a reference plane is typically made up of a solid layer or sheet of an electrically conductive metal such as copper. Defining larger clearances around a via at the reference plane layer does not affect the performance of the reference plane. Thus, according to some embodiments of the invention, clearances around a via at a reference plane layer can be defined to be larger than clearances around a via at a signaling layer. The increased clearance around a via at each reference plane layer allows the impedance of the via to be increased (due to the increased distance between the via and the reference plane conductor) so that the impedance of the via can be matched as closely as possible to the impedance of a signal transmission line in the circuit board.

Although reference is made to increasing the impedance of a via in some embodiments, it is contemplated that the impedance of a via can also be decreased to reduce impedance discontinuity between a signal transmission line and the via. Thus, more generally, the impedance of the via is said to be adjusted or tailored to reduce impedance discontinuity between a signal transmission line and a via. Reducing impedance discontinuity refers to reducing the difference in impedances of the signal transmission line and the via.

Figure 2:
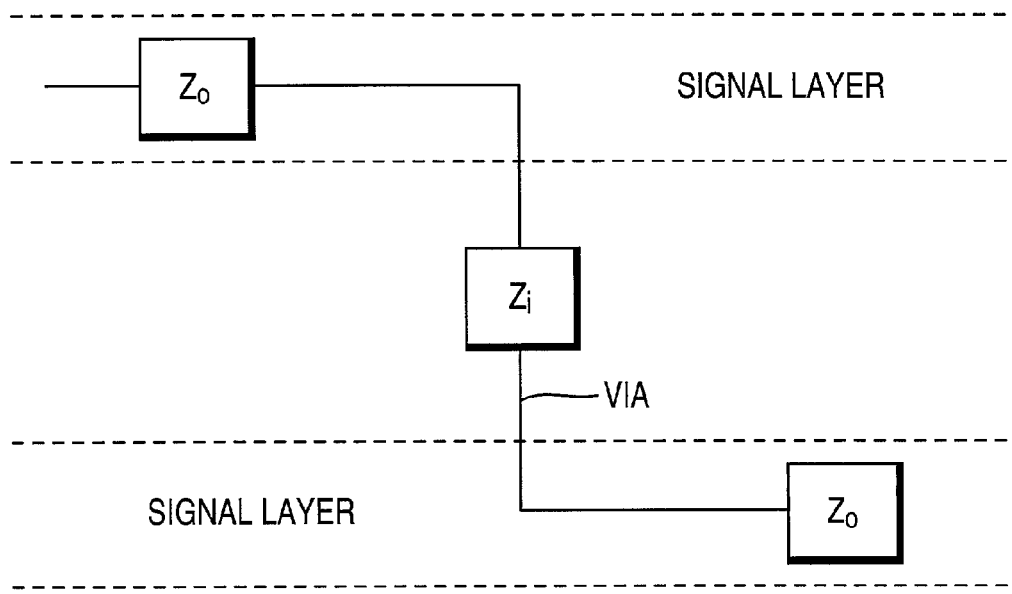
FIG. 2 is a schematic diagram of a signal path in the circuit board.

Schematically, the impedance of a signal transmission line in each signal layer is represented as $Z_o$, as shown in FIG. 2. FIG. 2 shows two signal transmission lines at two signal layers of the circuit board 100. FIG. 2 also shows the via as having a characteristic impedance $Z_i$. The via can be thought of as being a separate transmission line (with characteristic impedance $Z_i$) that is cascaded with signal transmission lines each with characteristic impedance $Z_o$.

Figure 3:
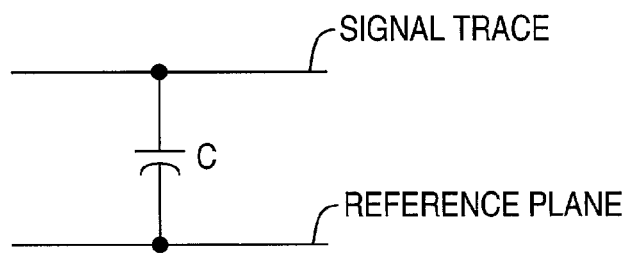
FIG. 3 is a schematic diagram of a transmission line.

As used here, a "signal transmission line" refers to a transmission line formed by the combination of a signal trace in a signal layer, a reference plane, and a dielectric layer between the signal trace and reference plane with a capacitance C. This is shown in FIG. 3. Similarly, a "via transmission line" refers to a transmission line formed by the combination of a via, one or more reference planes, and the dielectric between the via and the one or more reference planes.

A transmission line can be a parallel-plate transmission line or a two-wire transmission line. In either case, the characteristic impedance of a transmission line is derived from the inductance (L) and capacitance (C) of the transmission line:

$$Z_o \cong \sqrt{\frac{L}{C}}.$$

The inductance of a signal transmission line is dependent upon the width and thickness of the signal trace. The capacitance of the signal transmission line is dependent upon the spacing between the plates (the spacing between the signal trace and the reference plane), the type of dielectric between the signal trace and the reference plane, and the width of the signal trace. A circuit board is designed so that each signal transmission line has a characteristic impedance of 50 ohms, 75 ohms, or another target characteristic impedance.

However, due to its different arrangement, a via usually has a different impedance, which results in impedance discontinuity between the via transmission line and the signal transmission line. To avoid as much as possible the problem of reflections of signals transmitted over a signal path that includes one or more signal transmission lines and one or more via transmission lines, it is desired to match as closely as possible the impedance of the via transmission line to the impedance of the signal transmission line.

As noted above, this is accomplished by increasing the clearance between the via and each reference plane through which the via passes. Increasing the clearance between a via and a reference plane causes the effective capacitance of the via transmission line to be decreased so that the via characteristic impedance is increased. The increase in clearance is not provided at any signal layer so that routing space in the signal layer is not reduced. Thus, in accordance with some embodiments of the present invention, the impedance of a via can be tailored without sacrificing routing space at a signal layer of the circuit board.

The tailored via clearances around a via at a reference plane layer can be implemented just for signal paths over which high-frequency signals are expected. Thus, for low-frequency signal paths, the clearances around a via can be the same at signal layers and reference plane layers.

Figure 4:
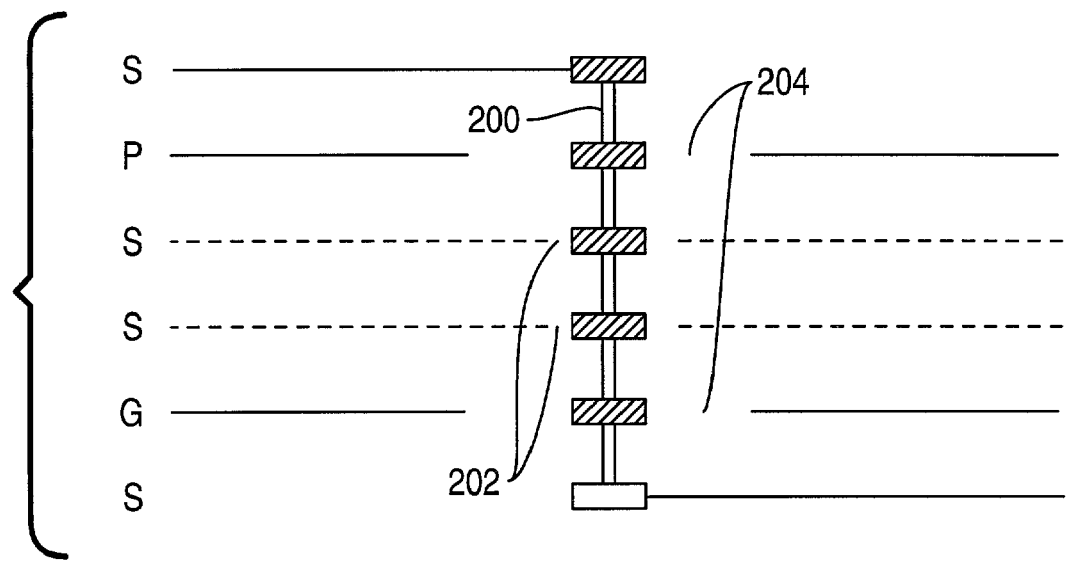
FIG. 4 is a cross-sectional view of the circuit board of FIG. 1.
Figure 5:
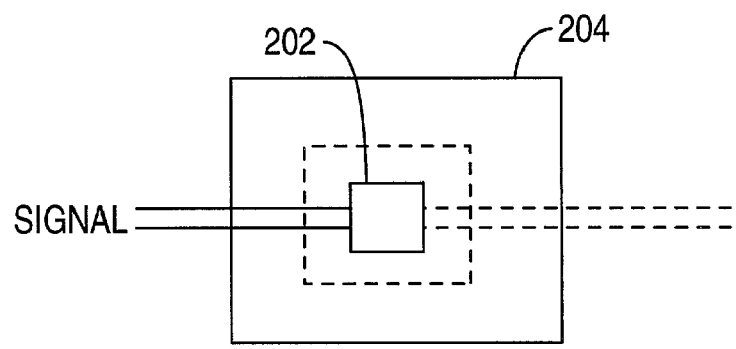
FIG. 5 is a top view to show the different dimensions of clearances at a signal layer and at a reference plane layer of the circuit board.

The different clearances around the via at different layers is illustrated in FIG. 4. As shown, a first clearance 202 having a first size is provided around a via at each of the signal layers 106 and 108. A second clearance 204 having a second, larger size is provided around the via at each of the reference plane layers 104 and 110. A top view of the difference sizes of the clearances 202 and 204 at the reference plane layers and at the signal layers is shown in a top view in FIG. 5.

Figure 6:
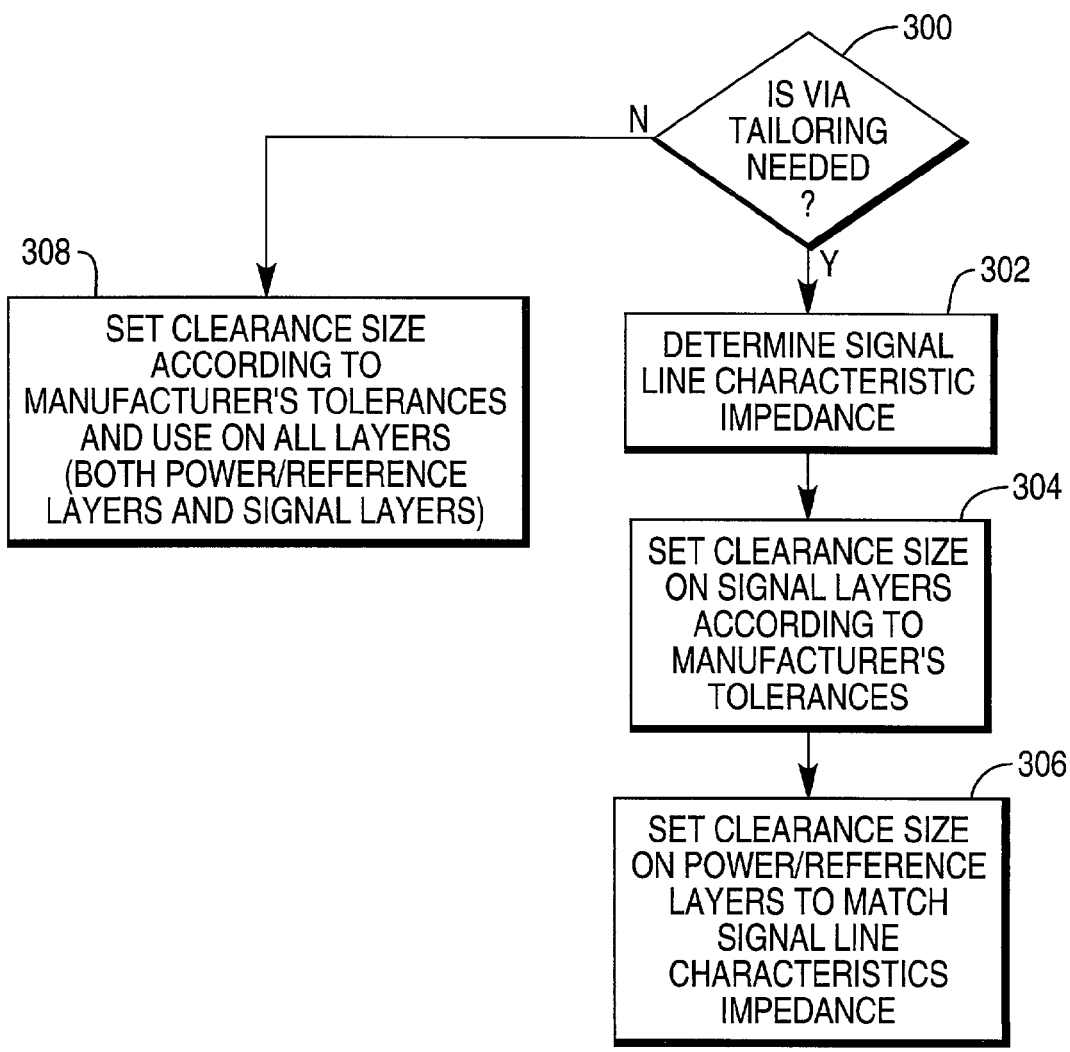
FIG. 6 is a flow diagram of a process of setting via clearance sizes.

Selection of the size of a tailored clearance around a via at a reference plane layer is based on the signal transmission line impedance. Thus, as shown in FIG. 6, it is first determined (at 300) if via clearance tailoring is needed for a given signal path. In most cases, tailoring is not needed for relatively low-frequency signal paths. For such vias, the clearance size at each circuit board layer, whether signal layer or reference layer, is set to the same size according to manufacturer's tolerances. If tailoring is needed, the signal transmission line characteristic impedance is determined (at 302). Next, the clearance size at each signal layer is set (at 304) according to manufacturer's tolerances. The size of the via clearance at each reference plane layer is then set (at 306) to tailor the impedance of the via to match as closely as possible the signal transmission line impedance. The procedure is repeated for each of the other signal paths on the circuit board.

The above procedure, in some embodiments, is automatically performed by software in a computer system. The software is stored as instructions on a storage medium. The instructions are loaded for execution in the computer system to perform predefined tasks.

While the invention has been disclosed with respect to a limited number of embodiments, those skilled in the art will appreciate numerous modifications and variations there from. It is intended that the appended claims cover such modifications and variations as fall within the true spirit and scope of the invention.

What is claimed is:

1. A circuit board comprising:
a first layer containing signal lines;
a second layer containing a reference plane; and
a via passing through the first layer and the second layer,
a first clearance defined around the via at the first layer, and
a second clearance defined around the via at the second layer, the second clearance being larger than the first clearance, the size of said second clearance selected to reduce impedance discontinuity between the via and a signal line connected to the via.

2. The circuit board of claim 1, further comprising a third layer and fourth layer each containing signal lines,
the via connecting a signal line at the third layer with a signal line at the fourth layer.

3. The circuit board of claim 2, further comprising a fifth layer containing another reference plane,
a third clearance defined around the via at the fifth layer, the third clearance having generally the same size as the second clearance.

4. The circuit board of claim 3, further comprising a sixth layer containing signal lines, the via also extending through the sixth layer,
a fourth clearance defined around the via at the sixth layer, the fourth clearance having generally the same size as the first clearance.

5. The circuit board of claim 2, wherein the signal line at the third layer is part of a transmission line associated with a characteristic impedance,
the second clearance being larger than the first clearance to increase an impedance of the via to reduce impedance discontinuity between the transmission line and the via.

6. The circuit board of claim 1, wherein each of the first and second clearances includes a region around the via at the corresponding layer, the region defining a space through which electrically conductive structures other than the via is not allowed.

7. The circuit board of claim 1, further comprising a main surface that is generally parallel with the signal lines and reference plane,
wherein the via passes through the first and second layers in a direction generally perpendicularly to the main surface of the circuit board.

8. A system comprising:
a circuit board including:
plural signal layers and plural reference plane layers,
a via extending through the plural signal layers and the plural reference plane layers,
a first-sized clearance formed around the via at each signal layer, and
a second-sized clearance formed around the via at each reference plane layer,
the second-sized clearance larger than the first-sized clearance, the size of said second-sized clearance selected to reduce impedance discontinuity between the via and a signal line connected to the via.

9. The system of claim 8, wherein the circuit board has a second via extending through the plural signal layers and plural reference plane layers, and
a first-sized clearance being formed around the second via at each of the signal layers and reference plane layers.

10. The system of claim 8, further comprising electronic devices mounted on the circuit board.

11. The system of claim 10, wherein the electronic devices comprise a central processing unit, the system further comprising a power supply and a hard disk drive.

* * * * *